United States Patent [19]

Davis

[11] Patent Number: 4,647,793

[45] Date of Patent: Mar. 3, 1987

[54] DRIVER CIRCUIT FOR GENERATING OUTPUT AT TWO DIFFERENT LEVELS

[75] Inventor: Walter L. Davis, Plantation, Fla.

[73] Assignee: Motorola, Inc., Schaumburg, Ill.

[21] Appl. No.: 646,552

[22] Filed: Aug. 31, 1984

[51] Int. Cl.$^4$ .................. H03K 3/01; H03K 3/159
[52] U.S. Cl. ................................ 307/270; 307/254; 307/350; 307/264
[58] Field of Search ............... 323/315; 330/288, 257; 307/350, 270, 264

[56] References Cited

U.S. PATENT DOCUMENTS

| | | |
|---|---|---|
| 3,475,061 | 10/1969 | Steinkamp et al. . |
| 3,764,931 | 10/1973 | Waku et al. .................... 307/264 |
| 3,877,001 | 4/1975 | Bogut et al. . |
| 3,932,797 | 1/1976 | York . |
| 4,143,283 | 3/1979 | Graf et al. . |
| 4,237,198 | 12/1980 | Eby et al. . |
| 4,344,003 | 8/1982 | Harmon et al. .................. 307/264 |
| 4,373,139 | 2/1983 | Beesley ........................... 307/350 |
| 4,469,959 | 9/1984 | Luke et al. ....................... 307/264 |
| 4,471,492 | 9/1984 | Mann et al. . |

Primary Examiner—Stanley D. Miller
Assistant Examiner—B. P. Davis
Attorney, Agent, or Firm—Martin J. McKinley; Daniel K. Nichols; Joseph T. Downey

[57] ABSTRACT

The present invention in the preferred embodiment comprises a plurality of current mirror circuit stages connected together for amplifying a first input signal and generating an output signal. A shunt path circuit is connected to the first stage of the plurality of current mirror stages and when activated by a second input signal shunts a portion of the first input signal to ground, thus reducing the current flow into the plurality of current mirror stages. During normal operation, when the shunt path circuit is inactivated, the last stage of the plurality of current mirror stages functions as a switch and passes all of the amplified first input signal. However, during the low power consumption mode, when the shunt path circuit is activated, the last stage of the plurality of current mirror circuit stages functions as a current mirror circuit and passes current at a considerably reduced level.

3 Claims, 1 Drawing Figure

DRIVER CIRCUIT FOR GENERATING OUTPUT AT TWO DIFFERENT LEVELS

BACKGROUND OF THE INVENTION

1. Field of the Invention

This invention relates to driver circuits, and more particularly to a driver circuit which is capable of generating an output signal at two different levels.

2. Description of the Prior Art

In the past, especially in paging environments, there has been a need to provide an audible low battery voltage alert to indicate to the user that the battery powering the radio paging device either needs to be recharged or replaced. Such prior art circuits have been designed such that when the battery voltage level has dropped to a predetermined level, the transducer driver amplifier is activated and drives the transducer at a relatively constant amplitude until the user acknowledges the alert by turning off the radio paging device and replacing or recharging the battery.

However, in many instances the user of a paging device is not wearing the radio paging device at the time the battery source is depleted to the predetermined voltage level at which the alert signal is activated. Thus, if the low voltage alert is sounded while the user is away from the radio paging device, and since the transducer driver amplifier drives the transducer at a relatively constant amplitude, the battery source may be rapidly depleted to a level whereby the alert is no longer sounded. Upon return to the location of the paging device, the user would be unaware that the radio paging device has been rendered inoperative by way of the depleted battery and an important message may be missed.

One such prior art device includes a voltage comparator having its inputs connected to the battery supply voltage and a voltage reference source, respectively. When the battery voltage drops to the level of the reference voltage, the comparator is triggered and generates an output signal. The output signal from the voltage comparator is directed to a microcomputer which, upon sensing the comparator output signal generates a squarewave output signal. The squarewave signal is directed to a transducer driver. The transducer driver is turned on by the squarewave signal and generates an output signal of a relatively constant amplitude to drive a transducer which generates an audible alert. The audible alert is generated until the pager is turned-off manually or until the battery is depleted to such a low level it cannot supply enough power to drive the transducer.

SUMMARY OF THE INVENTION

Accordingly, one object of the present invention is to provide a novel driver circuit which is capable of generating an output signal at at least two levels.

Another object of the present invention is to provide a novel driver circuit which consumes less power when operating in a low power mode than when operating in the normal mode.

It is yet another object of the present invention to provide a novel driver circuit having one current mirror stage which functions as a switch when the input current of the driver circuit is above a predetermined level and which functions as a current mirror circuit when the input current of the driver circuit is below a predetermined level.

It is still another object of the present invention to provide a novel driver circuit that applies a current source output signal to a load in order to apply a fixed output power level that is independent of supply voltage.

The above and other objects and advantages of the present invention are provided in the preferred embodiment by a plurality of current mirror circuit stages connected together for amplifying a first input signal and generating an output signal. A shunt path circuit is connected to the first stage of the plurality of current mirror stages and when activated by a second input signal shunts a portion of the first input signal to ground, thus reducing the current flow into the plurality of current mirror stages. During normal operation, when the shunt path circuit is inactivated, the last stage of the plurality of current mirror stages functions as a switch and passes all of the amplified first input signal. However, during the low power consumption mode, when the shunt path circuit is activated the last stage of the plurality of current mirror circuit stages functions as a current mirror circuit and passes current at a considerably reduced level.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 1:
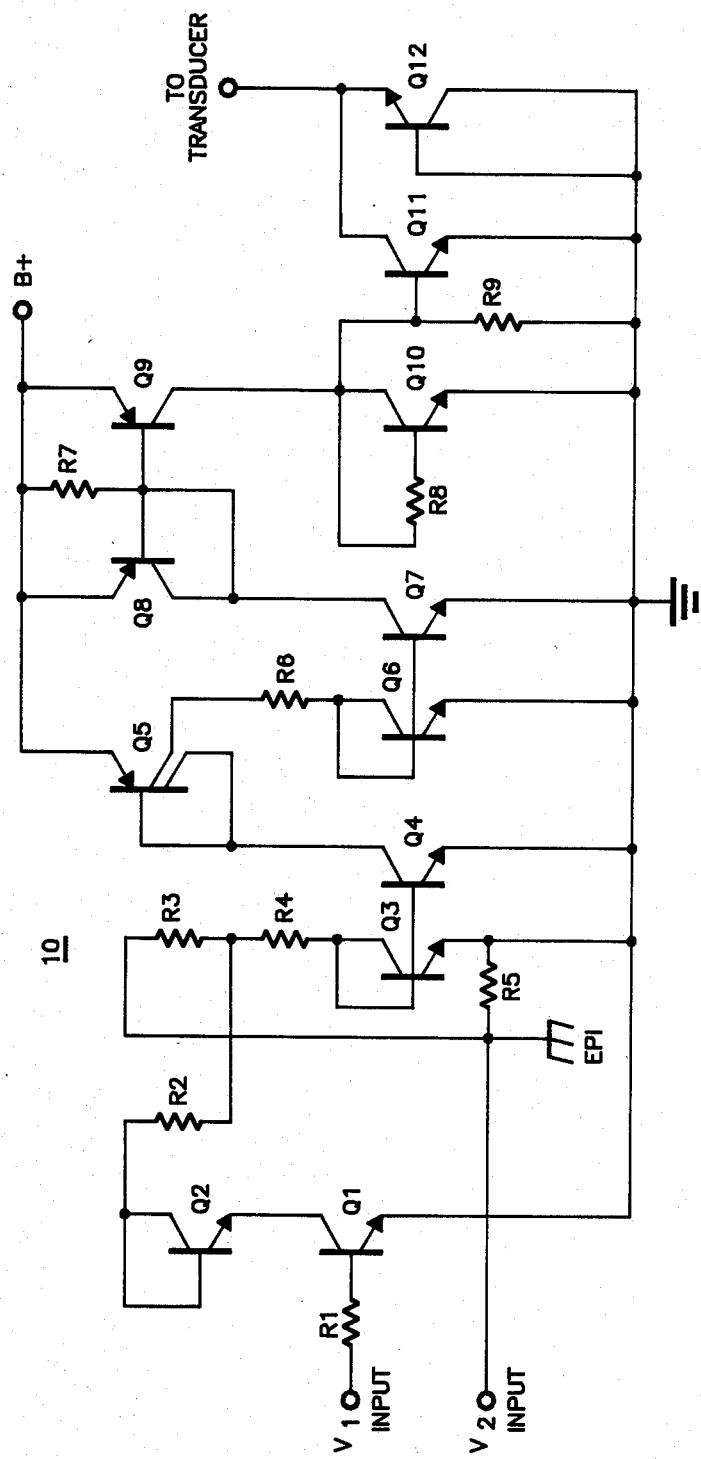
FIG. 1 is a schematic diagram of the present invention.

Referring now to the drawings, wherein like reference numerals designate indentical or corresponding parts throughout the several views, and more particularly to FIG. 1, a schematic diagram of the present invention is illustrated. This embodiment of the invention is intended for use in a radio paging device in which the transducer driver circuit normally generates a signal which drives a transducer which in turn generates an audible alert when the device receives an appropriately addressed selective calling signal. However, it should be realized that the driver circuit may be used to drive any annunciator, including both audio and visual types.

The base of the transistor Q1 is connected through the resistor R1 to the $V_1$ input terminal. In the preferred embodiment it is contemplated that the $V_1$ input would be connected to a microprocessor (not shown) which would generate a high signal to turn on the transistor Q1 a predetermined time after a low battery condition is detected. The emitter of the transistor Q1 is connected to ground. The collector of the transistor Q1 is connected to the diode Q2 while the other end of the diode Q2 is connected to one end of the resistor R2. The other end of the resistor R2 is connected to the junction of the resistors R3 and R4. The other input of the transducer driver circuit is connected to another output of the microprocessor which generates a squarewave signal when the low battery condition is detected. The other transducer driver input $V_2$ is connected to the transistor Q3 through the resistors R3 and R4. The input from the microprocessor is also connected to ground through the resistor R5. The transistor Q3 has its base and collector connected to one end of the resistor R4 and its emitter connected to ground. The base of the transistor Q4 is connected to the base of the transistor Q3 while its emitter is connected to ground. The collector of the transistor Q4 is connected to the base and one collector of the transistor Q5. The emitter of the transistor Q5 is connected to the battery supply voltage B+ while its other collector is connected to the base and collector of the transistor Q6 through the resistor R6. The emitter of the transistor Q6 is connected to ground while its base and collector are also connected to the base of the transistor Q7. The emitter of transistor Q7 is connected to ground while the collector of transistor Q7 is connected to the collector and base of transistor Q8. The emitter of transistor Q8 is connected to the battery supply voltage B+ while its base is connected to the base of the transistor Q9. The resistor R7 is connected between the battery supply voltage B+ and the bases of transistors Q8 and Q9. The collector of the transistor Q9 is connected to the collector of the transistor Q10. The base of the transistor Q10 is connected through the resistor R8 to the collectors of transistors Q9 and Q10. The base of the transistor Q11 is connected to the collectors of transistors Q9 and Q10 and to one end of the resistor R9 which has its other end connected to ground. The collector of the transistor Q11 is connected to the emitter of transistor Q12, this node also representing the output to the transducer (not shown). The emitter of transistor Q11 is connected to ground. The base and collector of the transistor Q12 are also connected to ground.

The transducer driver circuit 10 normally is off until a squarewave voltage waveform is received from the microprocessor (not shown) at the $V_2$ input. When the squarewave signal is received, the transducer driver is switched ON and OFF by the signal. The high input signal applies a current through the resistors R3 and R4 to the diode Q3. The current mirror formed by Q3 and Q4 generates an amplified signal that passes through each stage of the amplifier stages comprised of the transistors Q5 through Q11 and is further amplified through each stage until a current wave form is finally applied to the transducer driver circuit output. It should be remembered that the microprocessor generates a squarewave signal at the $V_2$ input when a low battery condition, in this case 1.1 volts, is detected. A predetermined period of time later, the microprocessor generates another signal which is received at the $V_1$ input to the transducer driver circuit 10 at one end of the resistor R1. The output signal from the microprocessor applies a current through R1 to the base of transistor Q1. This in turn causes the transistor Q1 to turn on and provide a shunt path to ground in the input current network of the transducer driver circuit 10. In particular, a large portion of the current being generated by the microprocessor is diverted from the junction of the resistors R3 and R4 to ground through the resistor R2, the diode Q2 and the transistor Q1. This substantially lowers the input current that is applied to the input of the amplifier, reduces the value of the transducer driver circuit 10 output current and significantly reduces the power consumed by the transducer driver circuit 10. It should be noted that the diode Q2 is a bias equalization element, such that when the device is in the reduced output mode, the voltage across the diode Q3 is matched by the voltage across diode Q2 to provide for a well defined current division ratio in the input current attenuator formed by R2, R3 and R4. It should be further understood that when there is no output from the microprocessor to the $V_1$ input of the transducer driver circuit 10, the amplifier portion of the transducer driver acts like a current mirror through the transistors Q3 through Q9. More precisely, the collector current of the transistor Q4 is twice the current that went into the diode Q3, the diode current going into Q6 is three times the base current of the transistor Q5. The collector current of Q7 is 10 times the current that flows into the diode Q6 and the collector current of the transistor Q9 is 8 times the current that flows into the diode Q8. However, keeping in mind that there is no input from the comparator to reduce the amplitude of the signal from the microprocessor at the input $V_1$ to reduce the amplitude of the signal from the microprocessor at the input $V_2$, there is enough current generated by the transistor Q9 so that the resistor R8 prevents the combination formed by transistors Q10 and Q11 from acting like a current mirror circuit. Instead, in this state, almost all of the collector current of the transistor Q9 flows into the base of the transistor Q11. This causes the transistor Q11 to act like a switch rather than a current mirror, with the result that Q11 is driven ON and OFF in a manner that drives the transducer with a minimum of power dissipation in Q11. So in the instance when the full output signal from the microcomputer received at the $V_2$ input flows through the amplifier stages of the output transistor driver, the transistor Q11 functions as a switch and applied the full supply voltage at the output of the driver circuit 10. Transistor Q12 functions to limit any flyback voltage excursion that may be generated by switching the transducer ON and OFF in this manner.

More specifically, for the high output mode of the amplifier shown in FIG. 1, the microcomputer applies an input current of 15 microamperes at the $V_2$ input to diode Q3 through the series combination of R2 and R3. This current is amplified or mirrored to 30 microamperes by transistor Q4 which is matched to Q8 but is 2 times larger in junction size. The output current of Q4 is further amplified to 90 microamperes by transistor Q5, and to 900 microamperes by ratioed transistors Q6 and Q7.

Thirty microamperes of the current from Q7 flows through resistor R7, and the remaining 870 microamperes is amplified to a level of 6.9 milliamperes by transistors Q8 and Q9. The purpose of R7 is to provide a shunt leakage path to insure that small leakage currents do not generate an output current when the amplifier is in the OFF state. Finally, 100 microamperes of the current from Q7 flows to ground through resistor R9, approximately 2 milliamperes flow through transistor Q10, and the remaining 4.7 milliamperes flows into the base of transistor Q11. This latter base current for Q11 enables this device to efficiently switch output currents of up to 200 milliamperes for nominal circuit values.

On the other hand, when the control signal from the microprocessor is received at the input $V_1$, transistor Q1 is switched ON and most of the input current from the microprocessor that flows through resistor R3 is directed to ground through resistor R2 and diode Q2. The result is that a greatly reduced level of current flows through R4 and into the input of the transducer driver amplifier. In one embodiment of the invention, resistors R2, R3 and R4 have values of 7 kilo-ohms, 80 kilo-ohms, and 80 kilo-ohms respectively. For these resistor values, and a microprocessor supply voltage of 3.0 volts, the microprocessor applies an input current of 15 microamperes at the V2 input to the amplifier input through the series combination of R2 and R3 when the volume control signal from the microprocessor is in the low or full output state. The input current to the amplifer is diminished to 2.2 microamperes when the volume control signal from the microprocessor is switched to the active or low output state.

In the low volume state, the input current into diode Q3 is amplified by the current mirror stages that form the transducer amplifier in much the same way that the input current is amplified in the high volume state, with one major exception. This exception is that in the reduced output mode, the circuit configuration composed of the combination of R8, Q10 and Q11 functions as a current mirror in which the output collector current of transistor Q11 accurately ratios the collector current of transistor Q10 wherein in the high output state, comparatively little of the current from transistor Q9 flows through Q10 and the output stage function as an efficient power switch in which the saturation voltage of transistor Q11 is minimized.

Specifically, in the low current mode, a current of 2.2 microamperes flows into diode Q3. This current is mirrored by device Q4, which is matched to Q3 but is 2 times larger in physical junction size. Thus, Q4 has a collector current of approximately 4.4 microamperes. This current from Q4 is further amplified by PNP transistor Q5, which is configured as a current mirror with a gain factor of 3 in the manner described previously for the combination of Q3 and Q4 according to principles that are well known in the integrated circuit design art. Thus, the output current of transistor Q5 is approximately 17.6 microamperes.

The output current from Q5 is further amplified by the current mirror formed by transistors Q6 and Q7, which have an area ratio of ten. Thus, the output collector current of this stage is approximately 176 microamperes.

The output current from Q7 is then applied to the current mirror formed by Q8 and Q9, which also have a resistor R7 with a value of 20 kilo-ohms connected across their emitter-base junction. Of the 176 microamperes supplied to this stage, approximately 30 microamperes flow through R7, and 146 microamperes flow into diode Q8. Transistor Q9 is matched to transistor Q8 with an area difference of 8 times, so that the output current of Q9 is approximately 1.2 milliamperes.

This current is applied to the next stage that is composed of transistors Q10 and Q11, and resistors R8 and R9. Resistor R9 functions as a leakage path and insures small leakage current will not activate or turn ON the output transistor Q11.

Transistors Q10 and Q11 and resistor R8 form a modified current mirror circuit in which the ratio of the output collector current of Q11 to the input collector current of Q10 is a function of the absolute level of the input current. Thus, at high input current levels, the base current of transistor Q10 develops a rather large voltage across resistor R8, with the result that transistor Q11 has a significantly higher base to emitter voltage than transistor Q10. As a direct consequence, transistor Q11 has a significantly higher junction current density than transistor Q10, and the net result is that at high levels of input current, comparatively little of the input current flows into transistor Q10 and the majority of the current flows into the base of Q11. This mode of operation optimizes the switching characteristics of transistor Q11 and provides for efficient operation of the amplifier in the full volume output mode.

For lower values of input current from transistor Q9, the modified current mirror circuit formed by Q10, Q11 and R8 functions as a current mirror that establishes a fixed value of output collector current for transistor Q11.

Specifically, of the 1.2 milliamperes that appears at the collector of Q9 in the low volume mode, approximately 100 microamperes flows through resistor R9 to ground. For a nominal transistor beta of 100, and a device area ratio of Q11 to Q10 of 24, approximately 240 microamperes flows into the base of Q11, and 860 microamperes flows into the collector of Q10. Thus, the base current of Q10 is 8.6 microamperes, and the voltage drop across R8 is 8.6 millivolts. These voltage and current levels agree with the well known theory that describes the current and voltage relationship of bipolar transistors, and the same theory can be used to modify the current levels at which the output stage operates.

Thus, in the low volume output mode, the output signal applied to the transducer by transistor Q11 switches from the voltage drive conditions that are used in the full output mode, to a current drive mode in which a square wave of current is applied. In the embodiment shown, this current waveform has a peak value of approximately 30 milliamperes.

Obviously (numerous additional) modifications and variations of the present invention are possible in light of the above teachings. It is therefore to be understood that within the scope of the appended claims, the invention may be practiced otherwise as specifically described herein.

What is claimed as new and desired to be secured by Letters Patent of United States is:

1. A driver circuit, comprising:
   first means, responsive to a first input signal, for generating an output signal at a first output level;
   second means, connected to said first means and responsive to a second input signal, for causing the output signal from said first means to be generated at a second output level;
   amplifier circuit means for applying said first input signal wherein said amplifier means comprises a plurality of current mirror circuits connected together with a known current gain;
   shunt patch circuit means, connected to said amplifier circuit means, for shunting a portion of said first input signal whereby said output signal is generated at said second output level; and
   output circuit means, for generating said output signal at said first output level in the absence of said second input signal and for generating said output signal at said second output level in response to said second input signal.

2. A driver circuit, according to claim 1, wherein said output circuit means further comprises;
   a current mirror circuit in which the ratio of the output current to the input current is a function of the absolute level of the input current such that at input current levels above a predetermined current level said current mirror circuit functions as a switch and at input current levels below said predetermined current level said current mirror circuit functions as a current mirror circuit.

3. A driver circuit, comprising:
   a plurality of current mirror circuit stages connected together for amplifying a first input signal by a known gain factor and generating an output signal;

a shunt path circuit, connected to the first current mirror circuit stage and responsive to a second input signal, for shunting a portion of said first input signal whereby the current flowing into said first current mirror circuit stage is reduced below a predetermined current level; the last current mirro circuit stage operating such that the ratio of its output current to input current is a function of the absolute level of the input current thereto such that when the current flowing into said first current mirror circuit stage is equal to or exceeds said predetermined current level the last current mirror circuit stage functions as a switch whereby said output signal is generated at a first level, and wherein the current flowing into said first current mirror circuit stage is below said predetermined current level the last current mirror circuit stage functions as a current mirror circuit whereby said output signal is generated at a predetermined level controlled by the multiplication ratio of said last current mirror circuit stage.

* * * * *